US008115474B2

(12) United States Patent
Vulovic et al.

(10) Patent No.: US 8,115,474 B2
(45) Date of Patent: Feb. 14, 2012

(54) MULTI-RANGE ELECTRICAL CURRENT MEASUREMENT

(75) Inventors: Marko Vulovic, Columbia, NJ (US);
Peyman Safa, Hopatcong, NJ (US);
Daniel R. Schwartz, North Bergen, NJ (US); Benjamin D. Hoover, Fort Collins, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 278 days.

(21) Appl. No.: 12/614,069

(22) Filed: Nov. 6, 2009

(65) Prior Publication Data

US 2011/0109300 A1    May 12, 2011

(51) Int. Cl.
*G01R 1/38* (2006.01)
*G01R 23/00* (2006.01)
*G01R 23/16* (2006.01)

(52) U.S. Cl. .................. 324/115; 324/76.19; 324/76.22

(58) Field of Classification Search .................. 324/115, 324/72.5, 762.01–762.1, 76.19–76.22, 99 D, 324/103 R, 103 P; 714/724; 257/48

See application file for complete search history.

(56) References Cited

U.S. PATENT DOCUMENTS

| 6,098,463 | A  | * | 8/2000 | Goldberg | ..................... | 73/646 |
| 6,452,373 | B2 | * | 9/2002 | Medelius et al. | ............... | 324/72 |
| 6,603,301 | B2 | * | 8/2003 | Benes | ......................... | 324/115 |

* cited by examiner

*Primary Examiner* — Huy Q Phan
*Assistant Examiner* — Tung X Nguyen

(57) ABSTRACT

An electrical current measurement system. A first low-range current gauge receives a current to be measured and provides a first intermediate value indicative of the amplitude of the current up to a first maximum current. A second low-range current gauge receives any portion of the current having a magnitude that exceeds the first maximum current and provides a second preliminary value indicative of the amplitude of the portion of the current having a magnitude that exceeds the first maximum current up to a second maximum current. An arithmetic unit or a digital processor receives the first intermediate value and the second preliminary value and provides a second intermediate value indicative of the amplitude of the current. A full-range current gauge may also be provided. A selector or the digital processor selects one of the values for display or other output.

20 Claims, 7 Drawing Sheets

US 8,115,474 B2

MULTI-RANGE ELECTRICAL CURRENT MEASUREMENT

BACKGROUND

One of the most basic, and important, measurements respecting electrical and electronic devices is the measurement of an unknown electrical current I. Current measurement has traditionally been performed by inserting a shunt of known resistance R in series with the current path, measuring the voltage drop V across the shunt, and converting the measured voltage to amperes (amps) by application of Ohm's Law: I=V/R.

To measure a wide range of currents, several different shunts are used. For example, a three-range ammeter (instrument that measures current) might use a shunt of 0.01 ohms for a measurement range of 0-10 amps (a voltage of 0.1 volt across such a shunt would indicate a current of 10 amps), a shunt of 0.1 ohms for a range of 0-1 amps (a voltage of 0.1 would indicate a current of 1.0 amps), and a shunt of 1.0 ohms for a range of 0-0.1 amps (a voltage of 0.1 would indicate a current of 0.1 amps).

A disadvantage of early ammeters was the need to manually substitute shunts, starting with the smallest resistance the operator believed to be appropriate for the current to be measured, until an appropriate reading could be obtained. Another disadvantage was that if the operator guessed wrong and inserted too high a shunt resistance, the resulting voltage would be too high and might make the voltmeter go off scale or even be damaged.

To overcome these disadvantages, ammeters with automatic range selection were developed. In such an ammeter, shunts would automatically be switched in and out one at a time, beginning with the smallest shunt resistance, until an appropriate measurement was obtained. Relays or switching transistors could be used for the switching. A dual-range electrical current measurement system is described in U.S. Pat. No. 6,603,301, issued to Michael Benes and assigned to the assignee of the present application. That disclosure represented a significant improvement over what was then the prior art as depicted in FIGS. 1 and 2 thereof. Referring to FIG. 4 thereof, a dual-range current measurement system includes a high-current sensor $R_H$ with an associated sense amplifier and a low-current sensor included within a 2-stage amplifier network. This network includes a bipolar current bypass consisting of FETs $Q_1$ and $Q_2$ that together shunt the current being measured to ground when the magnitude of that current exceeds the range of the low-current sensor.

Despite such advances in current measurement instruments, there remains a need for a way to measure an unknown electrical current with rapid settling time, glitch-free switching from one range to another, and minimum insertion impedance especially on low ranges.

SUMMARY OF THE INVENTION

Briefly and in general terms, an electrical current measurement system according to the principles of the invention has a first low-range current gauge that receives a current to be measured and provides, according to a first measurement gain, a first intermediate value indicative of the amplitude of the current up to a first maximum current. A second low-range current gauge receives any portion of the current having a magnitude that exceeds the first maximum current and provides, according to a second measurement gain, a second preliminary value indicative of the amplitude of the portion of the current having a magnitude that exceeds the first maximum current up to a second maximum current.

An arithmetic unit receives the first intermediate value and the second preliminary value and provides a second intermediate value indicative of the amplitude of the current.

One or more additional low-range current gauges may be included as desired, and for each an intermediate value is determined in a similar manner. A full-range current gauge that provides a full-range intermediate value indicative of the amplitude of the current may also be included. One of the intermediate values is selected to provide a signal indicative of the amplitude of the current.

The first intermediate value and the one or more preliminary values may be converted to digital form and provided to a processor for calculation of the amplitude of the current.

Other aspects of the invention and other embodiments are described below and depicted in the exemplary drawings.

DESCRIPTION OF THE EMBODIMENTS

Figure 1:
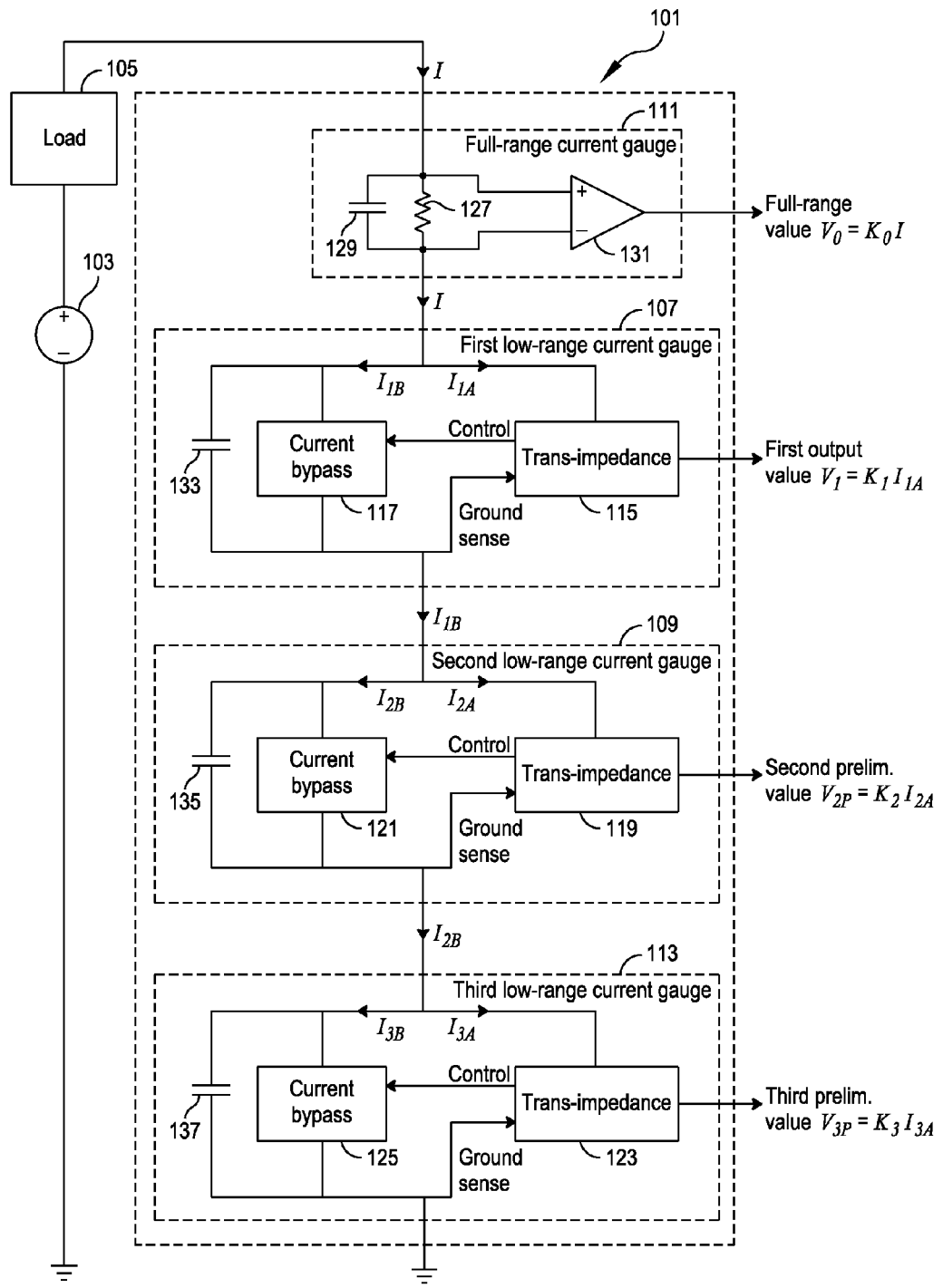
FIG. 1 is a partial block diagram of a multi-range current measurement system embodying the invention.

FIG. 1 depicts an electrical current measurement system 101 for measuring an unknown electrical current I according to one embodiment of the invention. The system 101 is in series with a power supply 103 and a load 105 to define a circuit through which the current I flows. The current measurement system 101 includes a first low-range current gauge 107 that receives the current I and provides according to a first measurement gain $K_1$ a first intermediate value $V_1$ indicative of the amplitude of the current up to a first maximum current $I_{1max}$.

If the magnitude of the current I exceeds the first maximum $I_{1max}$, the portion $I_{1B}$ of I having a magnitude that exceeds $I_{1max}$ is bypassed and only the portion $I_{1A}$ of I having a magnitude that does not exceed $I_{1max}$ is actually measured by the first low-range current gauge. It will be apparent that $I=I_{1A}+I_{1B}$. The current I may be a positive direct current, as indicated by the polarity of the power supply 103 which in the embodiment shown has a negative terminal connected to ground and a positive terminal connected to the load, or a negative direct current, or an alternating current. In any case, if the magnitude of I is less than $I_{1max}$, $I_{1A}$ will be equal to I and no current will be bypassed.

A second low-range current gauge 109 receives from the first low-range current gauge any portion $I_{1B}$ of the current I having a magnitude that exceeds $I_{1max}$ and provides according to a second measurement gain $K_2$ a second preliminary value $V_{2P}$ indicative of the amplitude of $I_{1B}$ up to a second maximum current $I_{2max}$. As in the first low-range current gauge, so here the current $I_{1B}$ may be considered as being of two parts: $I_{2A}$, being that portion of $I_{1B}$ having a magnitude that does not exceed $I_{2max}$, and $I_{2B}$, being that portion of $I_{1B}$ having a magnitude that exceeds $I_{2max}$. Thus, just as $I=I_{1A}+I_{1B}$, so $I_{1B}=I_{2A}+I_{2B}$.

Figure 2:
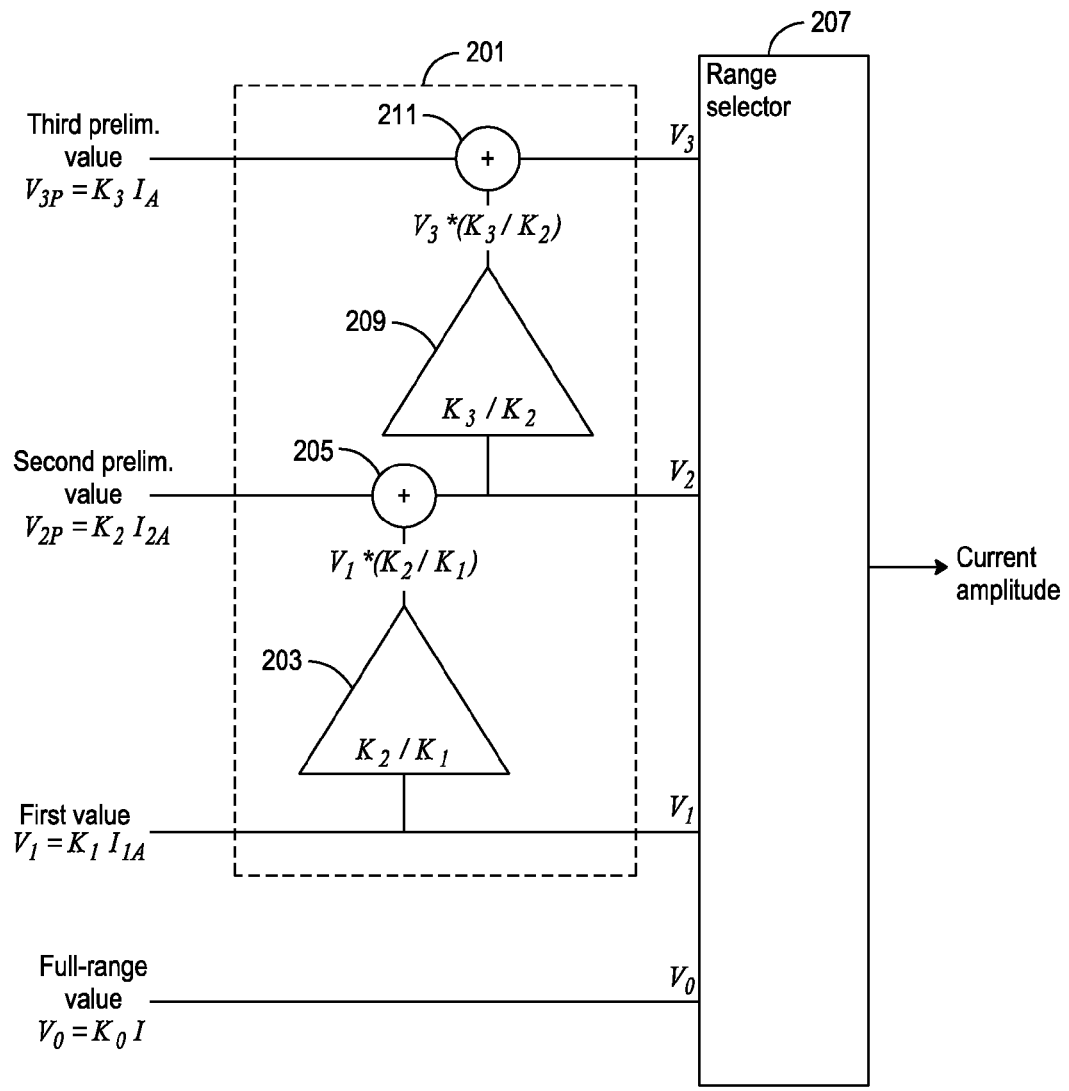
FIG. 2 is a logical block diagram of an arithmetic unit and range selector that may be used with the system of FIG. 1.

As shown in FIG. 2, an arithmetic unit 201 receives $V_1$ and $V_{2P}$ and provides a second intermediate value $V_2$ indicative of the amplitude of the portion of I having a magnitude that does not exceed $I_{2max}$.

In the embodiment shown, the arithmetic unit 201 multiplies $V_1$, for example in a multiplier 203, by a ratio of $K_2$ to $K_1$ to obtain a product. This product is added, for example in an adder 205, to $V_{2P}$ to provide the second intermediate value $V_2$.

Turning again to FIG. 1, a full-range current gauge 111 receives the electrical current I and provides a full-range intermediate value $V_0$ indicative of the amplitude of the current. A range selector 207 selects from among $V_1$, $V_2$, and $V_0$ to provide a signal indicative of the amplitude of the current I.

Some embodiments may include only the first and second low-range current gauges 107 and 109. Other embodiments also include the full-range current gauge 111. Still other embodiments may include more low-range current gauges to provide more measurement ranges. For example, the embodiment illustrated includes a third low-range current gauge 113. The gauge 113 receives from the second low-range current gauge 109 any portion of the current having a magnitude that exceeds $I_{2max}$ and provides a third preliminary value $V_{3P}$ indicative of the amplitude of that portion of the current I having a magnitude that exceeds $I_{2max}$ up to a third maximum current $I_{3max}$. The arithmetic unit 201 receives the second intermediate value $V_2$ and multiplies it in a multiplier 209 by a ratio of $K_3$ to $K_2$ to obtain a product. An adder 211 adds that product to $V_{3P}$ to provide a third intermediate value $V_3$. The range selector 207 then selects from among $V_0$, $V_1$, $V_2$, and $V_3$. The adder 211, the adder 205, the multiplier 203 and the multiplier 209 may be separate physical devices as shown, or two or more of them may be embodied in a single device that performs the additions and multiplications described. Additional current gauges may be added as desired to provide more current ranges.

The first low-range current gauge may include a first trans-impedance unit 115 that receives the current I to be measured. A first current bypass 117 is responsive to the first trans-impedance unit 115 to divert $I_{1B}$, being any of the current I having a magnitude that exceeds $I_{1max}$, around the first trans-impedance unit 115 to the second low-range current gauge 109. Thus, the current $I_{1A}$ that flows into the first trans-impedance unit 115 will be the same as the current I unless the magnitude of current I exceeds $I_{1max}$, in which case the current that flows into the first trans-impedance unit will be $I_{1max}$ and any of the current I having a magnitude that exceeds $I_{1max}$ will flow into the second low-range current gauge 109.

Similarly, the second low-range current gauge may include a second trans-impedance unit 119 that receives the current $I_{1B}$ from the first low-range current gauge 107. A second current bypass 121 is responsive to the second trans-impedance unit 119 to divert any current $I_{2B}$ having a magnitude that exceeds $I_{2max}$ around the second trans-impedance unit 119 to the third low-range current gauge 113. Thus, the current $I_{2A}$ that flows into the second trans-impedance unit 119 will be the same as the current $I_{1B}$ flowing into the second low-range current gauge 109 unless the magnitude of that current exceeds $I_{2max}$, in which case the current $I_{2A}$ that flows into the second trans-impedance unit will be equal to $I_{2max}$, and any excess current $I_{2B}$ will flow into the third low-range current gauge 113.

The third low-range current gauge may include a third trans-impedance unit 123 that receives the current $I_{2B}$ from the second low-range current gauge 109. A third current bypass 125 is responsive to the third trans-impedance unit 123 to divert any of the current $I_{2B}$ having a magnitude that exceeds $I_{3max}$ around the third trans-impedance unit 123 to a common return, or to a fourth low-range current gauge if more than three low-range current gauges are provided.

Figure 3:
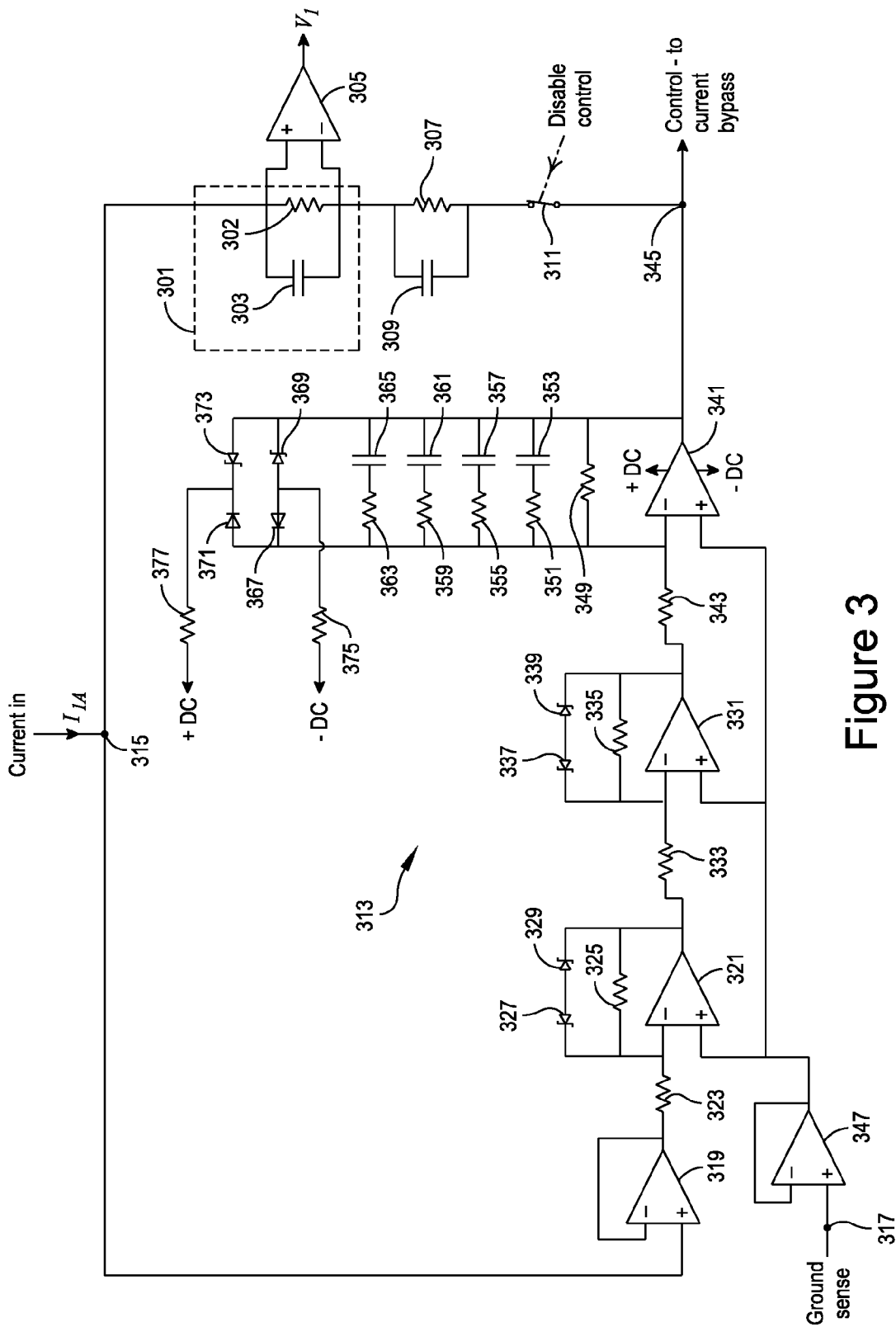
FIG. 3 is a schematic diagram of a first trans-impedance unit in the system of FIG. 1.

As shown in FIG. 3, in some embodiments a trans-impedance unit such as the first trans-impedance unit 115 includes a first current sense impedance 301 such as a resistor 302 and a capacitor 303 in parallel. A first sense amplifier 305 in electrical communication with the current sense impedance provides the first intermediate value $V_1$. The relationship between $V_1$ and the current flowing through the resistor 302 may be expressed as $V_1=K_1*I_1$, where $K_1=R*G$. R is the value of the resistor and G is the gain of the sense amplifier.

A parallel combination of a resistor 307 and a capacitor 309 is in series with the current sense impedance. A normally-closed switch 311 may be provided in series with the current sense impedance to interrupt the current flow path and thereby disable the trans-impedance unit, for example if desired for purposes of measuring and calibrating the offset error of the sense amplifier 305. The switch 311 may be solid-state, mechanical, or of some other nature as desired.

The remaining components shown in FIG. 3 constitute a first composite amplifier generally 313, to be described in more detail presently. The first composite amplifier 313, the first sense impedance 301, and the first sense amplifier 305 together with associated components 307-311 define the first trans-impedance unit. This trans-impedance unit presents to the current $I_{1A}$ a frequency-compensated impedance that is lower than the sense impedance by itself.

Figure 4:
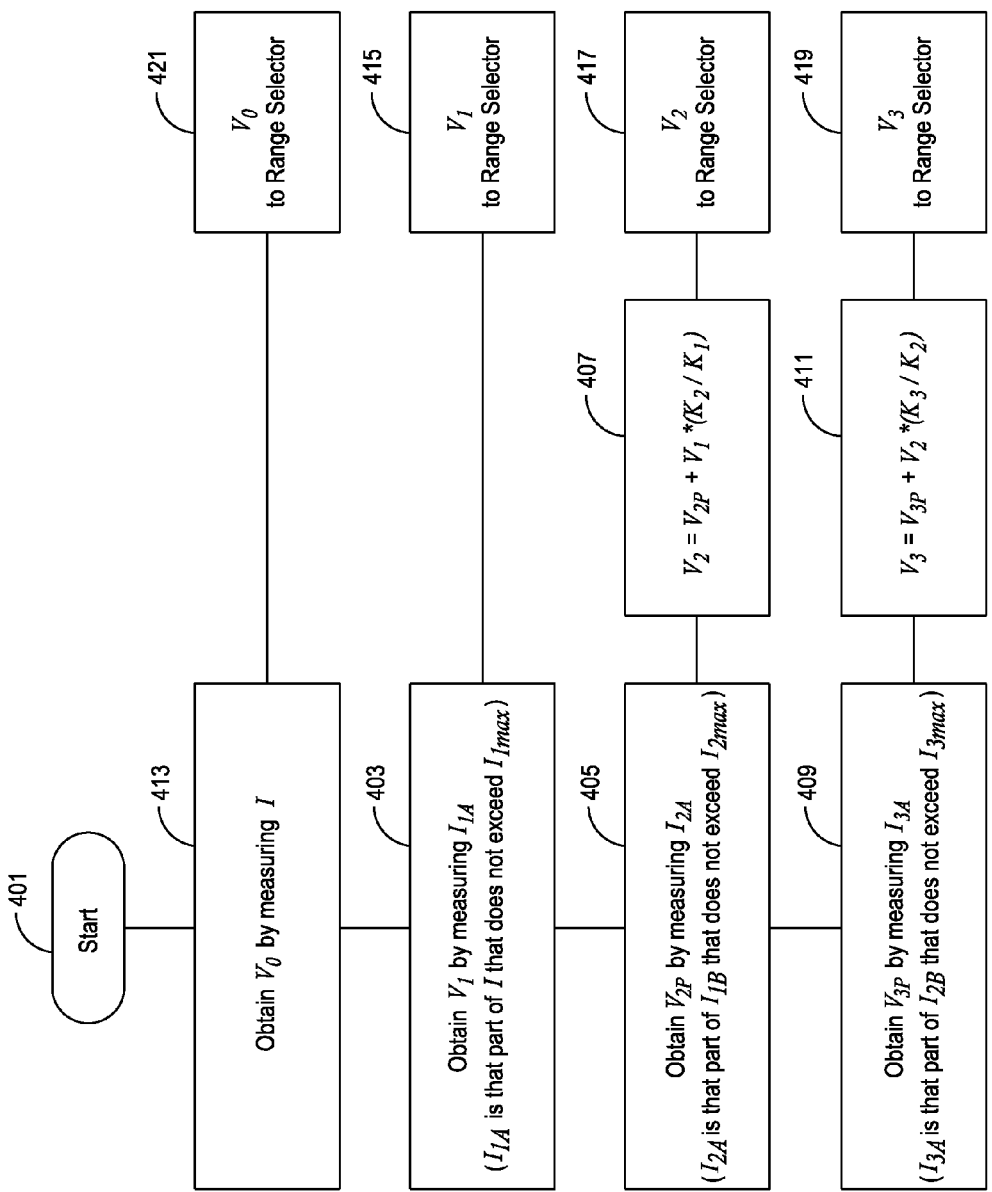
FIG. 4 is a flow chart illustrating calculation of intermediate values for the second and third low-range current gauges of FIG. 1.

As shown in FIG. 4, a method of measuring an electrical current according to an embodiment of the invention starts (401) by measuring (403) that portion of the current having a magnitude that does not exceed a first low-range maximum current to obtain a first intermediate value $V_1$, and measuring (405) the portion of the current having a magnitude that exceeds the first low-range maximum current to obtain a second preliminary value $V_{2P}$. A second intermediate value $V_2$ is calculated (407) from the first intermediate value and the second preliminary value.

The second intermediate value $V_2$ may be calculated by multiplying the first intermediate value $V_1$ by the ratio of the second low-range measurement gain ($K_2$) to the first low-range measurement gain ($K_1$) to obtain a product, and adding the product to the second preliminary value to provide the second intermediate value.

An additional measurement range may be provided by measuring (409) the portion of the current having a magnitude that exceeds the second low-range maximum current to obtain a third preliminary value $V_{3P}$. The second intermediate value $V_2$ is multiplied (411) by the ratio of the third low-range measurement gain ($K_3$) to the second low-range measurement gain ($K_2$) to obtain a product, and the product is added to the third preliminary value to provide a third intermediate value $V_3$.

The current may also be measured directly (413) to provide a full-range intermediate value $V_0$. The amplitude of the current is thereupon determined by selecting from among the first, second, third, and full-range intermediate values, for example according to which value gives a desired resolution. All the intermediate values $V_1$ (415), $V_2$ (417), $V_3$ (419), and $V_0$ (421) are provided to the range selector 207, and the range selector thereupon selects the value that best indicates the amplitude of the current I.

Figure 5:
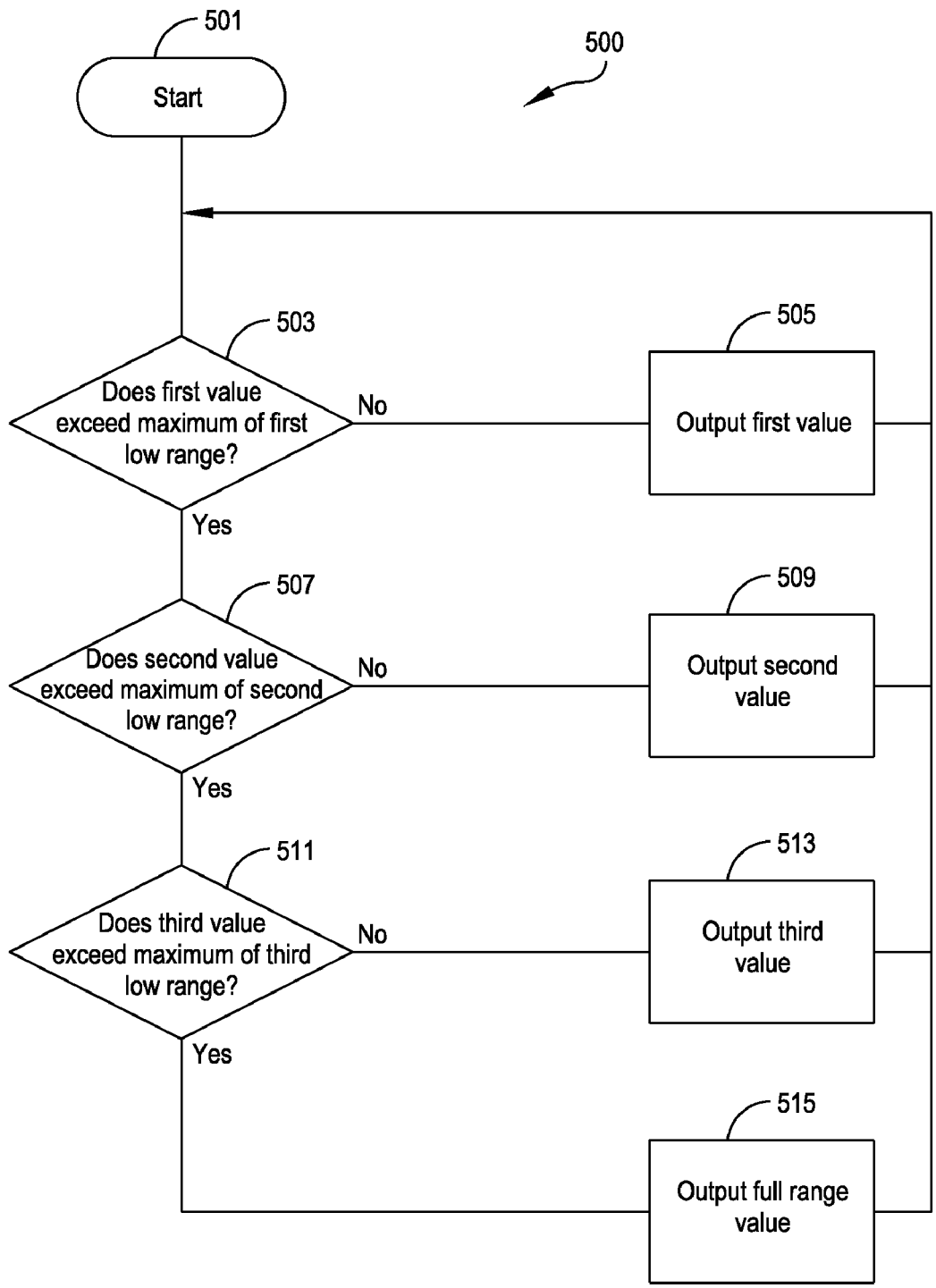
FIG. 5 is a flow chart illustrating selection of one of the values provided by the arithmetic unit of FIG. 2.

The range selector 207 may function as shown in FIG. 5 to select a value for display as a measurement of the current. Displaying a measurement generally 500 starts (501) with a determination (503) of whether the magnitude of the first value $V_1$ exceeds the maximum of the first low-range current gauge. If not, the first value is output (505), but if so, a determination is made (507) of whether the magnitude of the second value $V_2$ exceeds the maximum of the second low-range current gauge. If not, the second value is output (509), but if so, a determination is made (511) of whether the magnitude of the third value $V_3$ exceeds the maximum of the third low-range current gauge. If not, the third value is output (513), but if so, the full-range value is output (515). The process may be repeated as often as desired to continuously update the output.

The illustrated embodiments will now be described in more detail. Turning again to FIG. 1, the full-range current gauge 111 has a resistor 127 and a capacitor 129 in parallel connection to form a sense impedance in series with the flow of the current I. A sense amplifier 131, for example a stable controlled-gain instrumentation amplifier, is connected across the resistor 127. The capacitor 129 keeps the insertion impedance low at high frequencies, limits the bandwidth of the full-range current gauge to prevent the sense amplifier 131 from going into slew limit, and helps to assure a smooth roll-off of a measurement transfer function of the full-range current gauge.

A capacitor 133 is connected in parallel with the first current bypass unit 117 in the first low-range current gauge 107. This capacitor 133 reduces the insertion impedance of the first trans-impedance unit 115 at frequencies above the desired measurement bandwidth. In similar fashion, a capacitor 135 is connected in parallel with the second current bypass unit 121 in the second low-range current gauge 109, and a capacitor 137 is connected in parallel with the third current bypass unit 125 in the third low-range current gauge 113.

The composite amplifier will now be described with reference to FIG. 3. The resistor 307 and the capacitor 309 allow for control of the full-scale voltage at the output of the sense amplifier 305 and facilitate accurate clamping of an amplifier 341 (to be described in more detail presently). If these functions are not needed in a particular implementation, the resistor 307 and the capacitor 309 may be omitted.

The sense amplifier 305 may be a stable controlled-gain instrumentation amplifier similar to the sense amplifier 131 of FIG. 1.

The composite amplifier actively regulates the voltage at its current input (node 315) and the voltage at its ground sense input (node 317) to be equal. The composite amplifier is frequency-compensated to cause the trans-impedance unit 115 to present a lower impedance than that of the first current sense impedance alone when observed from the node 315. The composite amplifier includes three amplification stages to achieve the required gain-bandwidth, in some embodiments more or fewer amplification stages may be used as desired. The composite amplifier may simulate an inductive load over some or all of its frequency range, depending on selection of specific component values.

A first amplifier 319 is connected in a unity-gain buffer configuration with its negative input connected to its output and its positive input connected to the node 315. An output of the amplifier 319 is connected to a negative input of a second amplifier 321 through a resistor 323. A resistor 325 in parallel with anode-to-anode Zener clamping diodes 327 and 329 provides feedback from an output of the amplifier 321 back to its negative input. The output of the amplifier 321 is connected to a negative input of a third amplifier 331 through a resistor 333. A resistor 335 in parallel with anode-to-anode clamping Zener diodes 337 and 339 provides feedback from an output of the amplifier 331 back to its negative input. The output of the amplifier 331 is connected to a negative input of the amplifier 341 through a resistor 343. An output of the amplifier 341 provides a control output at a node 345 for the first current bypass unit 117.

Positive inputs of the amplifiers 321, 331 and 341 are connected together and to an output of a unity-gain buffer amplifier 347. A negative input of the amplifier 347 is connected to the output of the amplifier 347. A positive input of the amplifier 347 is connected to the ground sense input at the node 317.

In some embodiments, the switch 311 is implemented as an analog switch. Such a switch provides additional series resistance that helps prevent local instability of the last amplifier 341. If the switch 311 is implemented as a mechanical switch, an additional series resistance may be provided to accomplish this. The amplifier 341 has a feedback circuit between its negative input and its output. This feedback circuit includes the following in parallel: a resistor 349; a resistor 351 in series with a capacitor 353; a resistor 355 in series with a capacitor 357; a resistor 359 in series with a capacitor 361; a resistor 363 in series with a capacitor 365; a diode 367 anode-to-anode in series with a Zener diode 369; and a diode 371 cathode-to-cathode in series with a Zener diode 373.

The anode-to-anode connection of the diode 367 and the Zener diode 369 is connected to a negative power supply point through a resistor 375. The cathode-to-cathode connection of the diode 371 and the Zener diode 373 is connected to a positive power supply point through a resistor 377.

The clamping Zener diodes in the feedback circuits of the amplifiers 321 and 331, and the diodes in the feedback circuit of the amplifier 341, prevent amplifier saturation and improve speed when switching to a low range. The configuration of the clamp circuits in this embodiment is only one of many possible configurations that have a similar effect.

The composite amplifier is frequency-compensated by the above-described components to create a gain roll-off of 10 dB per decade. Depending on component values, this compensation may cause the insertion impedance of the trans-impedance unit 115 to appear as an inductor with 45 degrees of phase lag. This stabilizes the trans-impedance circuit 115 regardless of the amount of capacitance in the load 105. In some embodiments more or fewer parallel resistor-capacitor pairs, or other combinations of components in addition to, or in place of, the above-described components, may be used to create a similar effect as desired. In other embodiments the frequency compensation provided by the composite amplifier may reduce the impedance presented by the trans-impedance unit to a suitably low level, less than that of the sense impedance, without causing the impedance looking into the source to appear inductive.

The first current bypass unit 117 receives the current I and operates to conduct any portion $I_{1B}$ of the current I having a magnitude that exceeds the first maximum current $I_{1max}$ around the first trans-impedance unit 115.

Figure 6:
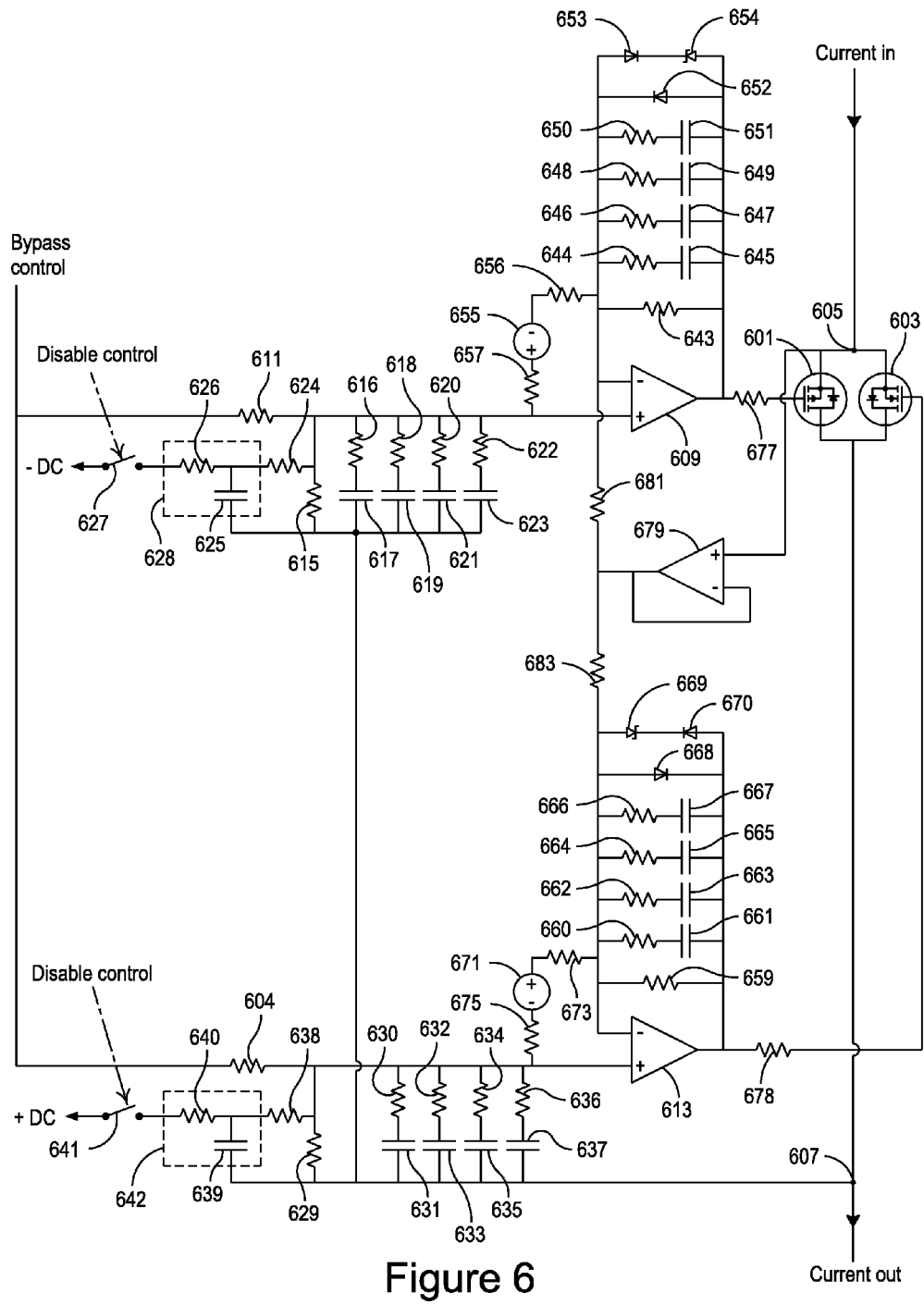
FIG. 6 is a schematic diagram of a first current bypass unit in the system of FIG. 1.

As shown in FIG. 6, the first current bypass unit 117 includes a P-type field-effect MOS transistor (PMOSFET) 601 and an NMOSFET 603 in a complementary parallel connection through which current flows when the current bypass circuit is active. One or the other of these transistors, depending on the polarity of the current, is activated whenever the magnitude of current I exceeds the first maximum current $I_{1max}$. The current that is being bypassed around the trans-impedance unit 115 through the PMOSFET 601 or the NMOSFET 603 enters the bypass unit at a node 605 and exits at a node 607.

The control output from the first trans-impedance unit 115 is provided to a positive input of an amplifier 609 through a resistor 611 and to a positive input of an amplifier 613 through a resistor 604. The positive input of the amplifier 609 is connected to a current output at the node 607 through a parallel connection of the following: a resistor 615; a resistor 616 and a capacitor 617 in series; a resistor 618 and a capacitor 619 in series; a resistor 620 and a capacitor 621 in series; a resistor 622 and a capacitor 623 in series; and a resistor 624 and a capacitor 625 in series. A resistor 626 is connected between a normally-open analog switch 627 and a junction of the resistor 624 and the capacitor 625. The resistor 626 and the capacitor 625 together form an RC divider 628.

The positive input of the amplifier 613 is connected to the current output at the node 607 through a parallel connection of the following: a resistor 629; a resistor 630 and a capacitor 631 in series; a resistor 632 and a capacitor 633 in series; a resistor 634 and a capacitor 635 in series; a resistor 636 and a capacitor 637 in series; and a resistor 638 and a capacitor 639 in series. A resistor 640 is connected between a normally-open analog switch 641 and a junction of the resistor 638 and the capacitor 639. The resistor 640 and the capacitor 639 together form an RC divider 642.

A negative input of the amplifier 609 is connected to the output of the amplifier 609 through a feedback network that includes the following in parallel: a resistor 643; a resistor 644 and a capacitor 645 in series; a resistor 646 and a capacitor 647 in series; a resistor 648 and a capacitor 649 in series; a resistor 650 and a capacitor 651 in series; a diode 652 with cathode connected to the negative input; and a diode 653 and a Zener diode 654 in cathode-to-cathode series connection. A negative end of a DC bias source 655 is connected to the negative input of the amplifier 609 through a resistor 656, and a positive end of the source 655 is connected to the positive input of the amplifier 609 through a resistor 657.

A negative input of the amplifier 613 is connected to the output of the amplifier 613 through a feedback network that includes the following in parallel: a resistor 659; a resistor 660 and a capacitor 661 in series; a resistor 662 and a capacitor 663 in series; a resistor 664 and a capacitor 665 in series; a resistor 666 and a capacitor 667 in series; a diode 668 with anode connected to the negative input; and a diode 669 and a Zener diode 670 in cathode-to-cathode series connection. A positive end of a DC bias source 671 is connected to the negative input of the amplifier 613 through a resistor 673, and a negative end of the source 671 is connected to the positive input of the amplifier 613 through a resistor 675.

The output of the amplifier 609 connects to a gate of the PMOSFET 601 through a resistor 677. The output of the amplifier 613 connects to a gate of the NMOSFET 603 through a resistor 678.

An amplifier 679 is configured as a unity-gain buffer and has a positive input connected to the current input at the node 605. An output of the amplifier 679 is connected to a negative input of the amplifier 679. The output of the amplifier 679 is connected to the negative input of the amplifier 609 through a resistor 681 and to the negative input of the amplifier 613 through a resistor 683.

The bias sources 655 and 671 and their associated resistors determine a threshold. Whenever the magnitude of the current flow into (or out of) the trans-impedance unit exceeds this threshold, one or the other of the FETs 601 and 603 is activated to bypass the current around the trans-impedance unit. As the current magnitude passes the threshold, one of the amplifiers 609 and 613 begins to actively regulate the voltage on the source of the connected FET to nearly zero, eventually driving the FET into saturation if the current reaches a high enough level. At that point, the insertion impedance of the first low-range current gauge 107 becomes the parallel combination of the saturated FET's on resistance and the bypass capacitor 133. The process reverses as the current magnitude decreases and falls below the threshold. The switches 627 and 641 (when closed) and 311 (when open) force all current to bypass the trans-impedance circuit 117, in effect disabling the first low range current gauge 107. The RC dividers 628 and 642 prevent this forced bypassing from happening so abruptly as to disrupt the output voltage seen by the load.

The amplifiers 609 and 613 are frequency-compensated to create a gain roll-off of 10 dB per decade. This compensation may cause the impedance looking into the source terminal of FETs 601 and 602 to appear as an inductor with 45 degrees of phase lag when the threshold is exceeded, but before the FET saturates. This stabilizes the amplifiers 609 and 613 regardless of the amount of capacitance in the load 105, even as low drain currents cause the effective source impedance of FETs 601 and 602 to become very large. In some embodiments more or fewer parallel resistor-capacitor pairs, or other combinations of components in addition to, or in place of, the above-described components, may be used to create a similar effect as desired. In other embodiments the frequency compensation provided by these amplifiers may reduce the impedance presented by the current bypass unit to a suitably low level, less than that of the FET source impedance, without causing the impedance looking into the source to appear inductive.

Due to parasitic offset errors in the system, for example the input offset voltage of the amplifier 319, the trans-impedance unit 115 does not regulate the voltages across the FETs 601 and 603 to exactly zero. This could create a situation in which, at the threshold current value, the voltage across the FET would be opposite in polarity to that which would be expected with a positive insertion impedance, causing the small-signal gain of the FET from $V_{gs}$ to $I_d$ to reverse polarity. Such a polarity reversal would in turn create positive feedback at DC, resulting in latch-up of the involved FET and its amplifier.

The DC insertion impedance of the trans-impedance unit 115 is roughly equal to the quotient of the DC feedback resistance of the composite amplifier over the open-loop DC gain of the composite amplifier. To prevent latch-up, the DC insertion impedance must be large enough to ensure that the magnitude of the voltage developed across the trans-impedance unit at the threshold current exceeds the sum of the worst-case DC offset errors from all sources.

The compensation provided by the composite amplifier allows unrestrained capacitive loading without destabilization. The rapid FET bypass switching and the lack of gate-source FET compensation provide low charge injection and correspondingly short settling times. The low bypass capacitance and high bandwidth of the composite amplifier provide a capability of current measurement over a wide range of frequencies. The FET amplifiers engage the FETs very rapidly, resulting in low voltage glitches when changing range in response to rapid input current fluctuations. High accuracy is provided by the effect of the differential sense amplifier 305 in removing any voltage offset from the composite amplifier.

Figure 7:
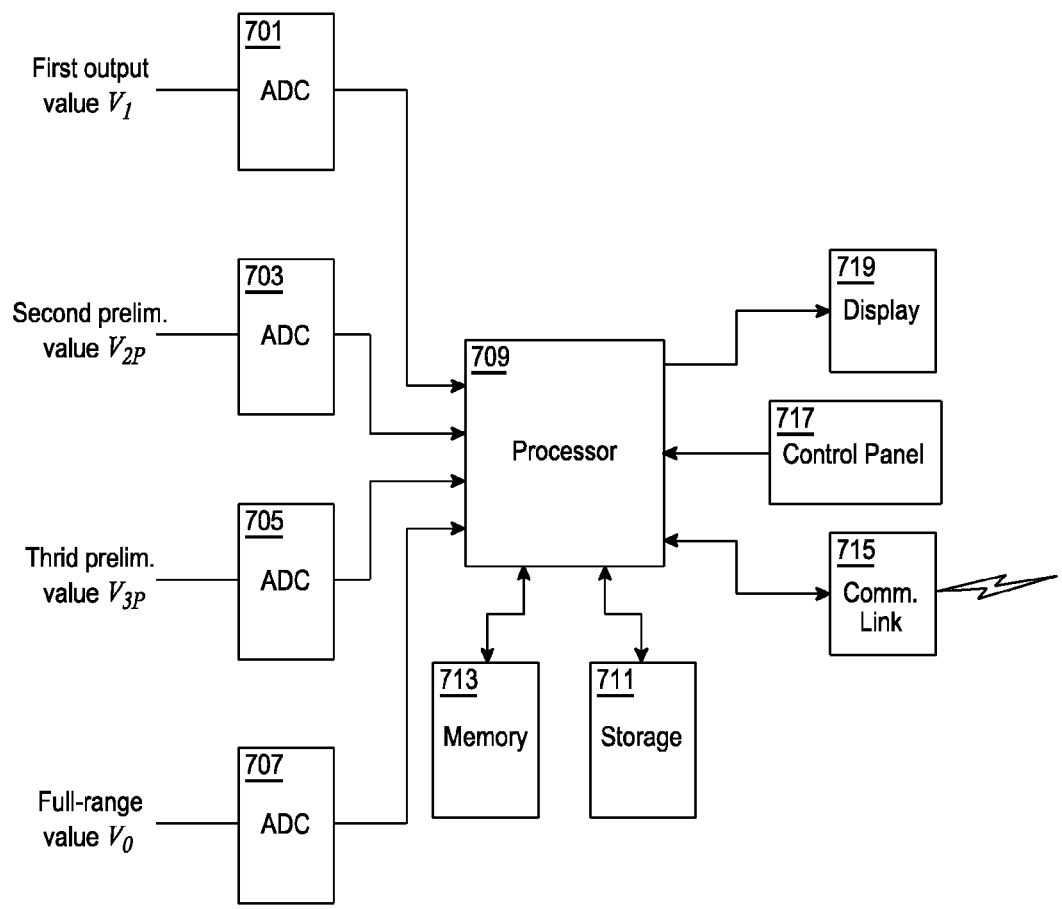
FIG. 7 is a block diagram of another embodiment of a multi-range current measurement system according to the principles of the invention.

Another embodiment of the invention is illustrated in FIG. 7. In this embodiment, the first intermediate value $V_1$, the second and third preliminary values $V_{2P}$ and $V_{2P'}$, and the full-range intermediate value $V_0$ are obtained by measuring the current I as described above and illustrated in FIGS. 1, 3 and 6. The first low-range current gauge 107 is connected to an analog-to-digital converter (ADC) 701 which converts the analog voltage value $V_1$ into digital form. Similarly, the second and third low-range current gauges 109 and 113 and the full-range current gauge 111 are connected to ADCs 703, 705 and 707, respectively, and the analog voltage values $V_{2P}$, $V_{3P}$ and $V_0$ are converted into digital form.

The first intermediate value $V_1$, the second and third preliminary values $V_{2P}$ and $V_{3P}$, and the full-range intermediate value $V_0$ all in digital form are applied to a processor 709. The processor 709 may be a general-purpose central processing unit (CPU), a specialized arithmetic processor, an ASIC, or any other device that can perform arithmetic operations on digital signals. The processor may operate under software control to perform the processing and calculations described above with reference to FIGS. 2, 4 and 5. Instructions that control the processor may be stored in a storage unit 711. The storage unit 711 may be, for example, flash memory, a magnetic storage medium, or some other device suitable for storing instructions. The instructions may be copied into a memory unit 713 for rapid access by the processor during operation. The instructions may be received from a remote location through a communication link 715. A user may communicate with the processor through a control panel 717 such as a keyboard or a set of specialized instrument controls and may receive the current amplitude from the processor through a display 719, or the user may communicate with, and receive the current amplitude from, the processor remotely through the communication link 715, or the current amplitude may be provided electronically to another electronic system such as a computer performing a process in which the current amplitude is used.

Although certain embodiments have been described and illustrated, various modifications and changes may be made without departing from the scope of the invention. Accordingly, the invention is to be limited only by the claims.

We claim:

1. An electrical current measurement system comprising:
   a first low-range current gauge that receives a current to be measured and provides a first intermediate value according to a first measurement gain, the first intermediate value indicative of the amplitude of the current up to a first maximum current;
   a second low-range current gauge that receives from the first low-range current gauge any portion of the current having a magnitude that exceeds the first maximum current and provides a second preliminary value according to a second measurement gain, the second preliminary value indicative of the amplitude of the portion of the current having a magnitude that exceeds the first maximum current up to a second maximum current; and
   an arithmetic unit that receives the first intermediate value and the second preliminary value and provides a second intermediate value indicative of the amplitude of the current.

2. An electrical current measurement system as in claim 1 wherein the arithmetic unit multiplies the first intermediate value by a ratio of the second measurement gain to the first measurement gain to obtain a product, and adds the product to the second preliminary value to provide the second intermediate value.

3. An electrical current measurement system as in claim 1 and further comprising:
   a full-range current gauge that receives the current and provides a full-range intermediate value indicative of the amplitude of the current; and
   a selector that selects from among the first intermediate value, the second intermediate value, and the full-range intermediate value to provide a signal indicative of the amplitude of the current.

4. An electrical current measurement system as in claim 3 and further comprising:
   a third low-range current gauge that receives from the second low-range current gauge any portion of the current having a magnitude that exceeds the second maximum current and provides a third preliminary value according to a third measurement gain, the third preliminary value indicative of the amplitude of the portion of the current having a magnitude that exceeds the second maximum current up to a third maximum current; and
   wherein:
   the arithmetic unit receives the third preliminary value and multiplies the second intermediate value by a ratio of the third measurement gain to the second measurement gain to obtain a product, and adds the product to the third preliminary value to provide a third intermediate value, and
   the selector selects from among the first, second, third and full-range intermediate values to provide a signal indicative of the amplitude of the current.

5. An electrical current measurement system as in claim 1 wherein the first low-range current gauge comprises:
   a first trans-impedance unit that receives the electrical current to be measured; and
   a first current bypass responsive to the first trans-impedance unit to divert any current having a magnitude that exceeds the first low-range maximum value from the first trans-impedance unit to the second low-range current gauge.

6. An electrical current measurement system as in claim 5 wherein the first trans-impedance unit comprises:
   a first sense impedance;
   a first sense amplifier in electrical communication with the first sense impedance and operative to provide the first intermediate value; and
   a first composite amplifier in electrical communication with the first sense impedance.

7. An electrical current measurement system as in claim 6 wherein the first composite amplifier and the first sense impedance together define a frequency-compensated impedance lower than the sense impedance.

8. An electrical current measurement system as in claim 7 wherein the frequency-compensated impedance simulates an inductive load over at least a portion of its frequency range.

9. An electrical current measurement system as in claim 6 wherein the sense impedance comprises a resistor and a capacitor in a parallel configuration.

10. An electrical current measurement system as in claim 6 wherein the first sense amplifier comprises an instrumentation amplifier.

11. An electrical current measurement system as in claim 5 and further comprising a bypass capacitor in parallel with the first current bypass.

12. An electrical current measurement system comprising:
   a first low-range current gauge that receives a current to be measured and provides a first intermediate value according to a first measurement gain, the first intermediate value indicative of the amplitude of the current up to a first maximum current;
   a second low-range current gauge that receives from the first low-range current gauge any portion of the current having a magnitude that exceeds the first maximum current and provides a second preliminary value according to a second measurement gain, the second preliminary value indicative of the amplitude of the portion of the current having a magnitude that exceeds the first maximum current up to a second maximum current; and a processor that receives the first intermediate value and the second preliminary value and provides a signal indicative of the amplitude of the current.

13. An electrical current measurement system as in claim 12 and further comprising
a third low-range current gauge that receives from the second low-range current gauge any portion of the current having a magnitude that exceeds the second maximum current and provides a third preliminary value according to a third measurement gain, the third preliminary value indicative of the amplitude of the portion of the current having a magnitude that exceeds the second maximum current up to a third maximum current; and
a full-range current gauge that receives the current and provides a full-range intermediate value indicative of the amplitude of the current.

14. An electrical current measurement system as in claim 13 and further comprising a storage unit and instructions in the storage unit operative to cause the processor to:
multiply the first intermediate value by a ratio of the second measurement gain to the first measurement gain to obtain a product and add the product to the second preliminary value to obtain a second intermediate value;
multiply the second preliminary value by a ratio of the third measurement gain to the second measurement gain to obtain a product and add the product to the third preliminary value to obtain a third intermediate value;
select the first intermediate value if that value is indicative of a current magnitude less than the first maximum current, else to select the second intermediate value if that value is indicative of a current magnitude less than the second maximum current, else to select the third intermediate value if that value is indicative of a current magnitude less than the third maximum current, else to select the full-range intermediate value; and
provide a signal indicative of the amplitude of the current according to the selected value.

15. An electrical current measurement system as in claim 14 and further comprising a visual display that receives the signal and provides a visual indication of the amplitude of the current.

16. A method of measuring an electrical current comprising:
measuring that portion of an electrical current having a magnitude that does not exceed a first low-range maximum current to obtain a first intermediate value;
measuring that portion of the current having a magnitude that exceeds the first low-range maximum current to obtain a second preliminary value; and
calculating a second intermediate value indicative of the current from the first intermediate value and the second preliminary value.

17. A method as in claim 16 wherein calculating the second intermediate value comprises:
multiplying the first intermediate value by a ratio of a second low-range measurement gain to a first low-range measurement gain to obtain a product; and
adding the product to the second preliminary value to provide the second intermediate value.

18. A method as in claim 17 and further comprising:
measuring that portion of the current having a magnitude that exceeds a second low-range maximum current to obtain a third preliminary value;
multiplying the second intermediate value by a ratio of a third low-range measurement gain to the second low-range measurement gain to obtain a product; and
adding the product to the third preliminary value to provide a third intermediate value.

19. A method as in claim 18 and further comprising directly measuring the current to provide a full-range intermediate value.

20. A method as in claim 19 and further comprising:
selecting from among the first, second, third and full-range intermediate values; and
providing a signal indicative of the amplitude of the current according to the selected intermediate value.

\* \* \* \* \*